US006259521B1

United States Patent
Miller et al.

(10) Patent No.: US 6,259,521 B1
(45) Date of Patent: Jul. 10, 2001

(54) METHOD AND APPARATUS FOR CONTROLLING PHOTOLITHOGRAPHY PARAMETERS BASED ON PHOTORESIST IMAGES

(75) Inventors: Michael Miller, Cedar Park; Greg Goodwin, Austin, both of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/412,216

(22) Filed: Oct. 5, 1999

(51) Int. Cl.⁷ .............................. G01N 21/00; G03F 7/00

(52) U.S. Cl. .......................................... 356/237.5; 430/30

(58) Field of Search ................................ 438/16; 430/30, 430/104; 356/300, 319, 450, 517, 237.2, 237.5, 237.1

(56) References Cited

U.S. PATENT DOCUMENTS 5,393,624 * 2/1995 Ushijima .
5,867,276 * 2/1999 McNeil et al. .

OTHER PUBLICATIONS

Bishop et al., "Use of Scatterometry for resist process control," SPIE Integrated Circuit Metrology, Inspection and Process Control, 1673:441–452, 1992.

Hickman et al., "Use of diffracted light from latent images to improve lithography control," SPIE Integrated Circuit Metrology, Inspection and Process Control, 1464:245–257, 1991.

McNeil et al., "Scatterometry applied to microelectronics processing—Part 1," Solid State Technology, 37(3):29–56, 1993.

Miller and Mellicamp, "Development of an end–point detection procedure for the post–exposure bake process," Integrated circuit metrology, inspection, and process control IX: 20–22, Feb., 1995, Santa Clara, California, SPIE Integrated Circuit Metrology, Inspection and Process Control, 2439:78–88, 1995.

Milner et al., "Latent image exposure monitor using scatterometry," SPIE Integrated Circuit Metrology, Inspection and Process Control, 1673:274–283, 1992.

Prins et al., "Scatterometric sensor for PEB process control," Metrology, inspection, and process control for microlithogtaphy, X:11–13, Mar., 1996, Santa Clara, California, SPIE Integrated Circuit Metrology, Inspection and Process Control,2725:710–719, 1996.

(List continued on next page.)

Primary Examiner—Charles Bowers
Assistant Examiner—Evan Pert
(74) Attorney, Agent, or Firm—Williams, Morgan & Amerson, P.C.

(57) ABSTRACT

A method for controlling uniformity in a wafer is provided. A wafer is provided. A layer of photoresist is formed on the wafer, and the photoresist layer is patterned. A portion of the patterned photoresist layer is illuminated in at least first and second positions. Light reflected at the two positions is measured to generate first and second measurements. A recipe of a stepper is adjusted in response to the first measurement differing from the second measurement. A wafer processing system includes a stepper, a scatterometer, and a process controller. The stepper is adapted to expose a layer of photoresist in accordance with a recipe to generate an exposed layer of photoresist. The scatterometer is adapted to take first and second measurements in at least first and second positions on the exposed layer of photoresist. The process controller is adapted to compare the first and second measurements and adjust the recipe based on the first and second measurements.

22 Claims, 4 Drawing Sheets

OTHER PUBLICATIONS

Raymond et al., "Multiparameter process metrology using scatterometry," In: Optical characterization techniques for high–performance microelectronic device manufacturing II, SPIE—The International Society for Optical Engineering, 2638:84–93, Austin, Texas, Oct. 25–26, 1995.

Raymond et al., "Scatterometric sensor for lithography," Manufacturing process control for microelectronic devices and circuits, SPIE—The International Society for Optical Engineering, 2336:37–49, Austin, Texas, Oct. 20–21, 1994.

Sturtevant et al., "Post–exposure bake as a process–control parameter for chemically–amplified photoresist," Metrology, inspection, and process control for microlithogtaphy, VII:2–4, Mar., 1993, Santa Jose, California, SPIE Integrated Circuit Metrology, Inspection and Process Control, vol. 1926, 1993.

Sturtevant et al., "Use of scatterometric latent image detector in closed loop feedback control of linewidth," SPIE Integrated Circuit Metrology, Inspection and Process Control, 2196:352–359, 1994.

* cited by examiner

METHOD AND APPARATUS FOR CONTROLLING PHOTOLITHOGRAPHY PARAMETERS BASED ON PHOTORESIST IMAGES

BACKGROUND OF THE INVENTION

1. Field of the Invention

This invention relates generally to photolithography techniques for patterning semiconductor devices, and, more particularly, to a method and apparatus for controlling photolithography parameters based on photoresist images.

2. Description of the Related Art

Conventionally, semiconductor devices are patterned using photolithographic processes. A base material, such as a substrate material, a metal, an insulator, etc., is coated with a light sensitive material, referred to as a photoresist material. The photoresist is generally a composition that is sensitive to active rays of light, such as ultraviolet rays, X-rays or electron rays. The photoresist is deposited on the base material to selectively protect non-process portions of the substrate. Light is then selectively directed onto the photoresist film through a photomask, or reticle, to form photoresist patterns on the base material. The photoresist is then developed to remove either the exposed photoresist or the unexposed photoresist.

There are generally two types of photoresist, namely positive type and negative type. The positive photoresist is of such a type that the exposed portion dissolves in the developer, while the unexposed portion does not dissolve therein, and the negative photoresist is of the opposite type. Certain photoresist materials do not complete the transition from being soluble to being insoluble in the developer based solely on the exposure to light. These photoresist materials, referred to as chemically-amplified photoresists, are subjected to a post exposure bake process to complete the chemical reaction to transition from soluble to insoluble (i.e., for a positive resist).

A known technique for evaluating the acceptability of the photolithography process involves measuring critical dimensions or other parameters after the photoresist has been developed. One method to evaluate the developed wafer is to use scatterometry to generate an intensity measurement indicative of the pattern on the wafer. The pattern in the developed photoresist appears as a series of trenches. Light is reflected differently in the trenched vs. the non-trenched areas, resulting in a characteristic scattering pattern. The scatterometry measurements may be used to change the photoresist operating parameters, such as exposure time, post exposure bake time, develop time, etc. to affect the pattern formed on subsequent lots of wafers. A limitation of a post develop measurement technique is that significant time elapses between the measurement and the corrective action, potentially resulting in numerous unusable wafers.

The process of using a chemically-amplified photoresist is described in greater detail in reference to FIGS. 1A through 1D. FIG. 1A shows a wafer 10 including a base material 12 with a photoresist layer 14 deposited thereon. In FIG. 1B, the photoresist layer 14 is exposed to a light source through a reticle (not shown) to define exposed regions 16. Exposure to the light causes hydrogen free radicals to form in the exposed regions 16. In FIG. 1C, the wafer 10 is subjected to a post exposure bake to complete the solubility transition chemical reaction and form baked regions 18. During the post exposure bake, the free radicals diffuse laterally and react with the photoresist 14 around the exposed regions 16.

Typically, for a deep UV photoresist layer 14, the post exposure bake time is about 60–90 seconds. As shown in FIG. 1D, a developer may then be applied to remove the remaining photoresist 14 (i.e., for a negative resist—not shown) or to remove the baked portions 18 (i.e., for a positive resist—shown in FIG. 1D).

The present invention is directed to overcoming, or at least reducing the effects of, one or more of the problems set forth above.

SUMMARY OF THE INVENTION

One aspect of the present invention is seen in a method for controlling uniformity in a wafer. A wafer is provided. A photoresist layer is formed on the wafer, and the photoresist layer is patterned. A portion of the patterned photoresist layer is illuminated in at least first and second positions. Light reflected at the two positions is measured to generate first and second measurements. A recipe of a stepper is adjusted in response to the first measurement differing from the second measurement.

Another aspect of the present invention is seen in a wafer processing system including a stepper, a scatterometer, and a process controller. The stepper is adapted to expose a layer of photoresist in accordance with a recipe to generate an exposed layer of photoresist. The scatterometer is adapted to take first and second measurements in at least first and second positions on the exposed layer of photoresist. The process controller is adapted to compare the first and second measurements and adjust the recipe based on the first and second measurements.

BRIEF DESCRIPTION OF THE DRAWINGS

The invention may be understood by reference to the following description taken in conjunction with the accompanying drawings, in which like reference numerals identify like elements, and in which.

Figure 1A:
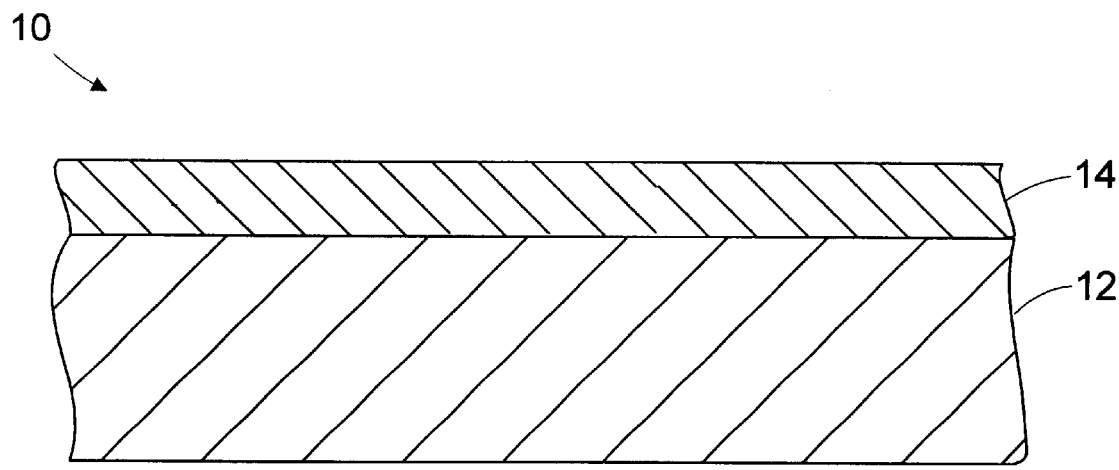
FIG. 1A is a cross-section view of a prior art substrate with a layer of photoresist formed thereon.
Figure 1B:
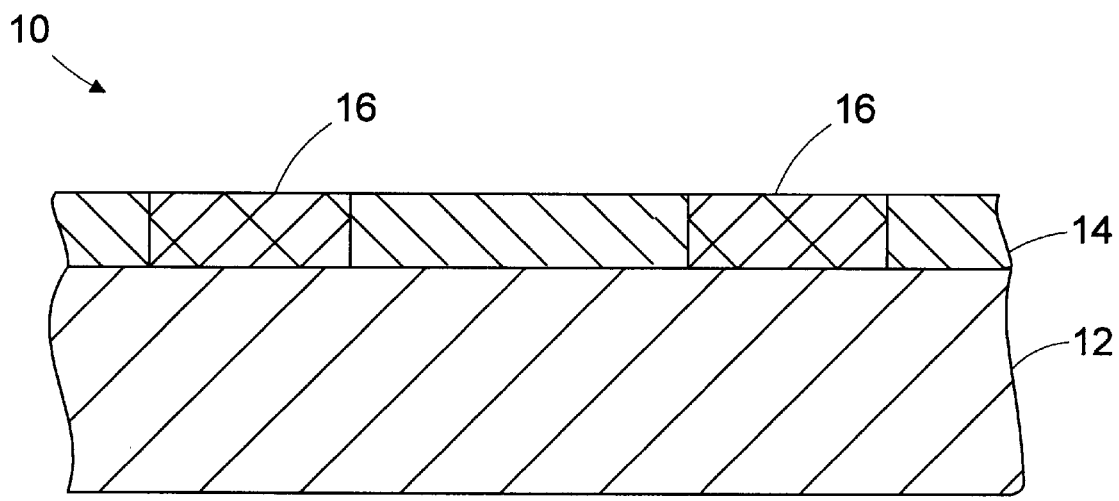
FIG. 1B is a cross-section view of the substrate of FIG. 1A after the photoresist has been exposed to a light source.
Figure 1C:
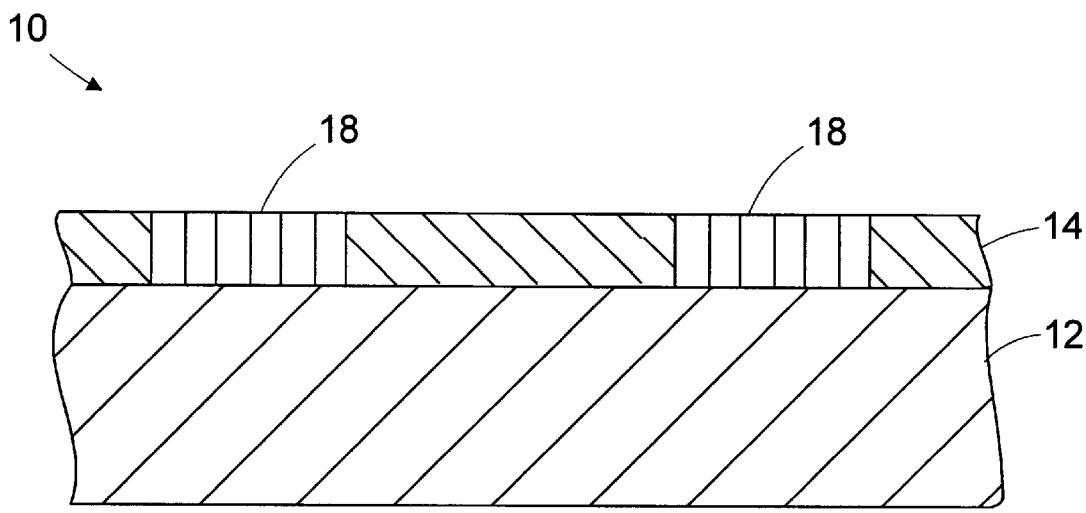
FIG. 1C is a cross-section view of the substrate of FIG. 1B after the substrate has been subjected to a post exposure bake process.
Figure 1D:
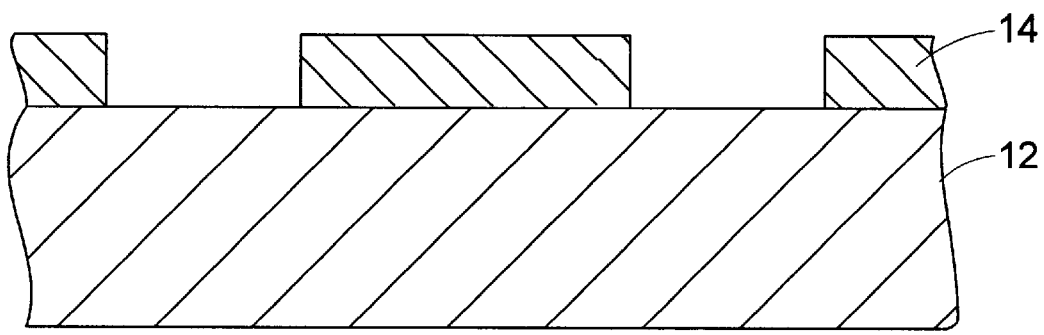
FIG. 1D is a cross-section of the substrate of FIG. 1B after the photoresist has been developed to remove the exposed portions.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
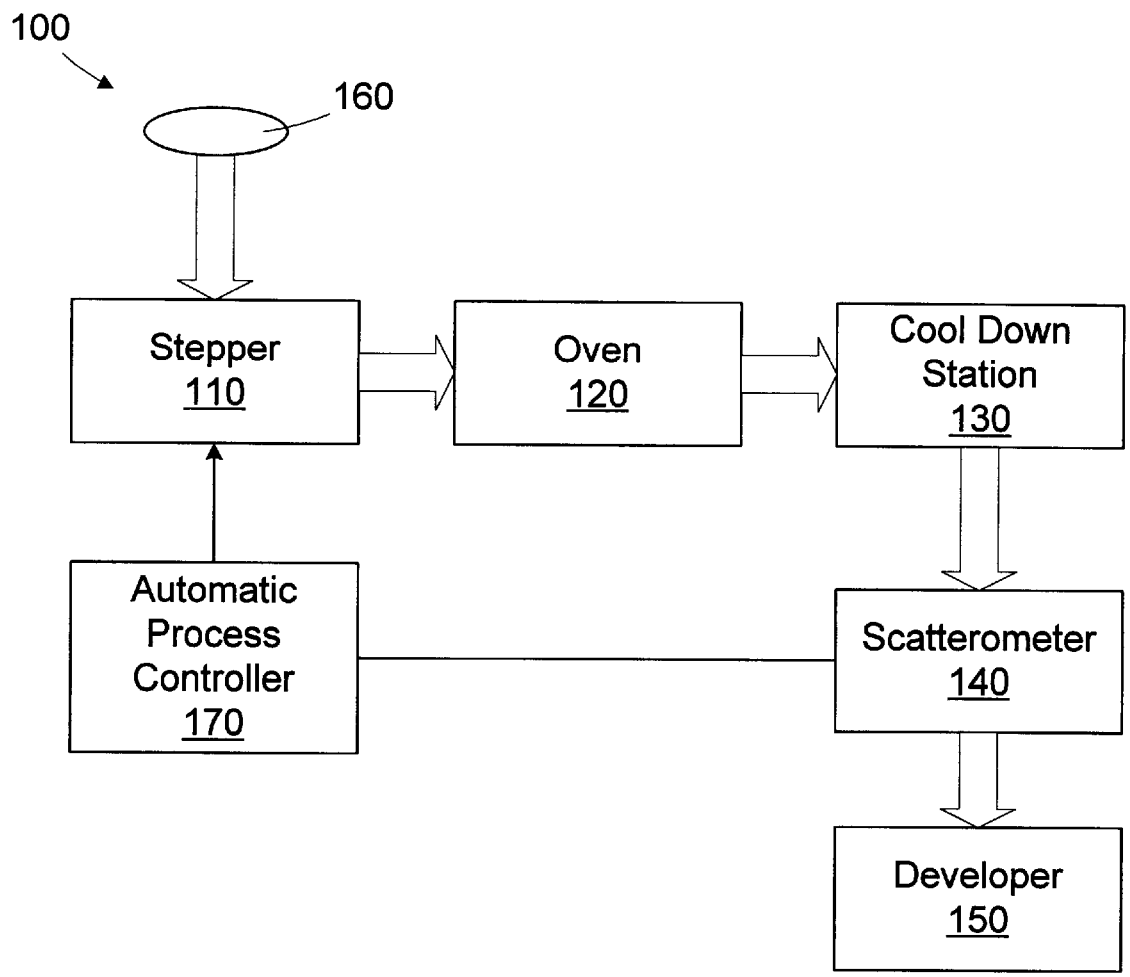
FIG. 2 is a simplified diagram of an illustrative processing line for performing photolithography patterning.

Referring now to the figures, and in particular, to FIG. 2, a simplified diagram of an illustrative processing line 100 for performing photolithography patterning is provided. The processing line 100 includes a stepper 110, an oven 120, a cool down station 130, a scatterometer 140, and a developer 150. The stepper 110 receives a wafer 160 (i.e., or lot of wafers) and exposes the wafer 160 to a light source using a reticle to pattern the wafer 160. The wafer 160 is transferred to the oven 120, where a post exposure bake is conducted. Following the post exposure bake, the wafer 160 is transferred to a cool down station 130, and then to the scatterometer 140 after the wafer 160 has sufficiently cooled. As described in greater detail below, the scatterometer 140 measures the wafer 160 to determine the acceptability and/or uniformity of the previously performed photolithography processes and conveys wafer measurements to an automatic process controller 170. The automatic process controller 170, based on the wafer measurements, adjusts the recipe of the stepper 110. The wafer 160 is then transferred to the developer 150, where the exposed photoresist is removed. As will be recognized by those of ordinary skill in the art in light of this disclosure, the processing line 100 may include discrete or integrated processing tools for performing the processing steps described herein.

Figure 3:
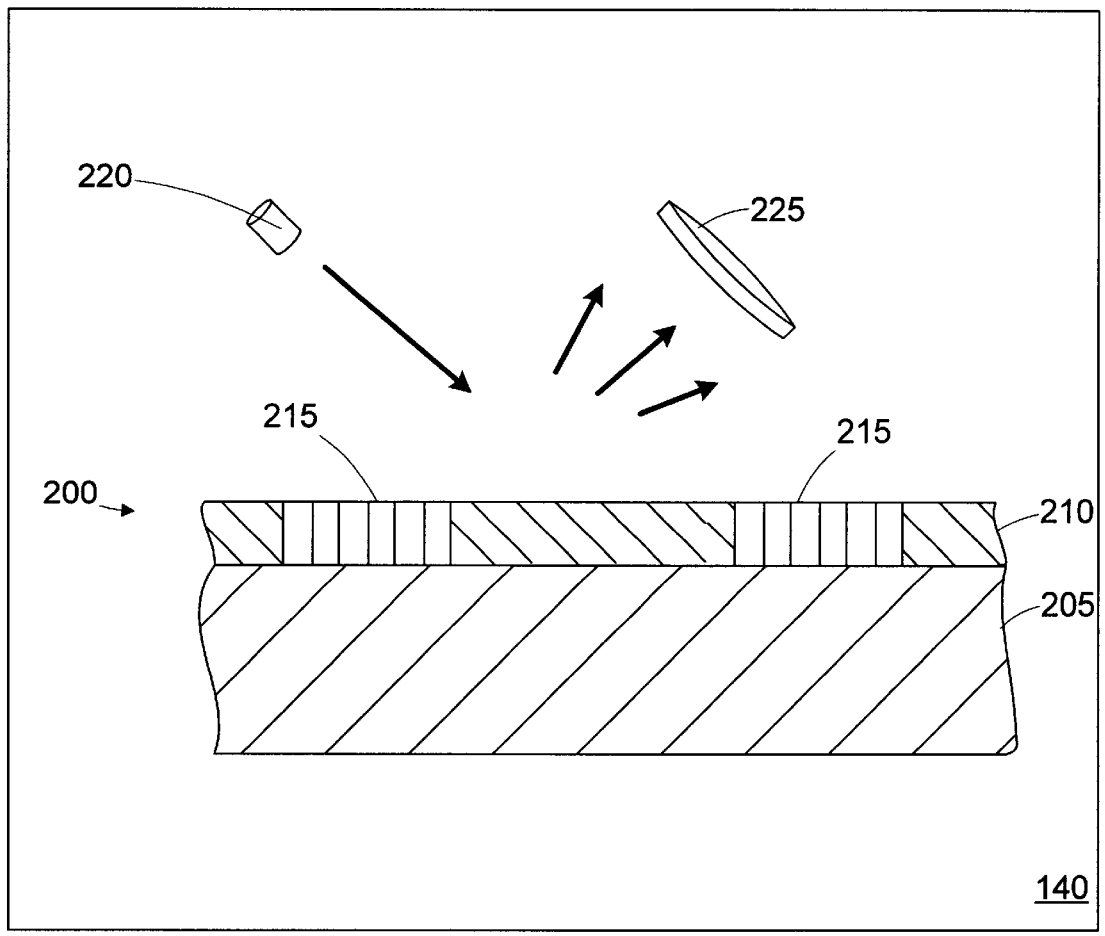
FIG. 3 is a simplified view of the scatterometer of FIG. 2 with a wafer loaded therein.

Referring to FIG. 3, a simplified view of the scatterometer 140 with the wafer 160 loaded therein is provided. The wafer 160 has a base material 205. The photoresist layer 210 has baked regions 215 formed on the base material 205 resulting from the previous exposure and baking steps (i.e., referred to as a patterned wafer 160). The chemical change resulting in the change in solubility of the baked regions 215 also results in the baked regions 215 having an index of refraction different than that of the unexposed photoresist layer 210.

The scatterometer 140, includes a light source 220 and a detector 225 positioned proximate the wafer 160. The light source 220 of the scatterometer 140 illuminates at least a portion of the wafer 160, and the detector 225 takes optical measurements, such as intensity, of the reflected light. Although the invention is described using a scatterometer 140 designed to measure reflected light intensity, it is contemplated that other measurement tools, such as an ellipsometer, a reflectometer, a spectrometer, or some other light measuring device may be used. It is also contemplated that the scatterometer 140 may use monochromatic light, white light, or some other wavelength or combinations of wavelengths, depending on the specific implementation. The angle of incidence of the light may also vary, depending on the specific implementation.

The differences in the refractive indices for the baked regions 215 and the unexposed photoresist layer 210 cause light scattering, resulting in a decrease in the intensity of the reflected light as compared to scattering in the photoresist layer 210 before exposure and baking. The scatterometer 140 measures the intensity at different points on the wafer 160, such as on the periphery and in the middle. A difference in the light intensity between various points indicates a nonconformity, such as a variation in the line widths of the baked regions 215. The light analyzed by the scatterometer 140 typically includes a reflected component (i.e., incident angle equals reflected angle) and a scattered component (i.e., incident angle does not equal the reflected angle). For purposes of discussion hereinafter, the term "reflected" light is meant to encompass both components.

The automatic process controller 170 adjusts the recipe of the stepper 110 to correct the nonconformity. For example, if the intensity measurement on the periphery of the wafer 160 is greater than the intensity measurement in the middle, the line width is presumably less, because a smaller line width causes less scattering. To correct the line width variation, the automatic process controller 170 changes the recipe of the stepper such that the exposure sites (e.g., individual die) with smaller line widths receive either an increased energy exposure or a longer duration exposure.

Detecting variations and adjusting the stepper 110 recipe prior to the developer 150 allows a quicker corrective action response. It is contemplated that all wafers 160 in a lot may be tested, or only selected wafers 160 in the lot. Identifying variations early allows correction of wafers 160 even in the same lot. For more stable steppers 110, the scatterometer 140 may be used only once per shift or once per week, depending on the specific implementation.

In the illustrated embodiment, the photoresist layer 210 is of a chemically-amplified type. In cases where a non-chemically-amplified photoresist material is used, the scatterometer 140 may be stationed prior to the oven 120. In a non-amplified photoresist system, the pattern is essentially complete after exposure in the stepper 110. The post exposure bake in the oven 120, which may be optional, is conducted to smooth the edges in the pattern resulting from standing waves, rather than to complete the patterning. Thus, the exposed portions already have an index of refraction different than the unexposed patterns, and the scatterometer 140 may be used.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for controlling uniformity in a wafer, comprising:
   providing a wafer;
   forming a photoresist layer on the wafer;
   patterning the photoresist layer;
   illuminating a portion of the patterned photoresist layer in at least first and second positions;
   measuring light reflected at the two positions to generate first and second measurements; and
   adjusting an exposure in a recipe of a stepper in response to the first measurement differing from the second measurement.

2. The method of claim 1, further comprising exposing a subsequent wafer having a layer of photoresist in the stepper based on the adjusted recipe.

3. The method of claim 1, wherein measuring the reflected light includes measuring the intensity of the reflected light.

4. The method of claim 3, wherein adjusting the recipe includes increasing an exposure intensity of the stepper in a location corresponding to the first position in response to the first measurement being greater than the second measurement.

5. The method of claim 3, wherein adjusting the recipe includes increasing an exposure duration of the stepper in a location corresponding to the first position in response to the first measurement being greater than the second measurement.

6. The method of claim 3, wherein adjusting the recipe includes decreasing an exposure intensity of the stepper in a location corresponding to the first position in response to the first measurement being less than the second measurement.

7. The method of claim 3, wherein adjusting the recipe includes decreasing an exposure duration of the stepper in a location corresponding to the first position in response to the first measurement being less than the second measurement.

8. A wafer processing system, comprising:
    a stepper adapted to expose a layer of photoresist in accordance with a recipe to generate an exposed layer of photoresist;
    a scatterometer adapted to take first and second measurements in at least first and second positions on the exposed layer of photoresist; and
    a process controller adapted to compare the first and second measurements and adjust the exposure recipe based on the first and second measurements.

9. The wafer processing system of claim 8, wherein the first and second measurements include light intensity measurements.

10. The wafer processing system of claim 8, wherein the scatterometer comprises a light source and a light detector, the detector being arranged to measure light from the light source reflected off the patterned wafer.

11. The wafer processing system of claim 8, wherein the stepper is adapted to expose the layer of photoresist in the first position using a first intensity and expose the layer of photoresist in the second position using a second intensity, and the process controller is adapted to adjust one of the first and second intensities based on the first and second measurements.

12. The wafer processing system of claim 11, wherein the process controller is adapted to raise the first intensity based on the first measurement being greater than the second measurement.

13. The wafer processing system of claim 11, wherein the process controller is adapted to lower the first intensity based on the first measurement being less than the second measurement.

14. The wafer processing system of claim 8, wherein the stepper is adapted to expose the layer of photoresist in the first position using a first exposure duration and expose the layer of photoresist in the second position using a second exposure duration, and the process controller is adapted to adjust one of the first and second exposure durations based on the first and second measurements.

15. The wafer processing system of claim 14 wherein the process controller is adapted to raise the first exposure duration based on the first measurement being greater than the second measurement.

16. The wafer processing system of claim 14 wherein the process controller is adapted to lower the first exposure duration based on the first measurement being less than the second measurement.

17. The wafer processing system of claim 8, further comprising an oven adapted to receive the exposed wafer and bake the exposed wafer for a predetermined period of time to generate a patterned wafer, the scatterometer being adapted to receive and measure the patterned wafer.

18. A method for fabricating wafers, comprising:
    exposing at least first and second positions of a photoresist layer, a first exposure setting being associated with the first position and a second exposure setting being associated with the second position;
    measuring light reflected off the photoresist layer in the first and second positions to generate first and second measurements; and
    adjusting one of the first and second exposure settings based on the first measurement differing from the second measurement.

19. The method of claim 18, wherein the first and second exposure settings comprise exposure intensities, and adjusting one of the first and second exposure settings includes increasing the first exposure setting in response to the first measurement being greater than the second measurement.

20. The method of claim 18, wherein the first and second exposure settings comprise exposure intensities, and adjusting one of the first and second exposure settings includes decreasing the first exposure setting in response to the first measurement being less than the second measurement.

21. The method of claim 18, wherein the first and second exposure settings comprise exposure durations, and adjusting one of the first and second exposure settings includes increasing the first exposure setting in response to the first measurement being greater than the second measurement.

22. The method of claim 18, wherein the first and second exposure settings comprise exposure durations, and adjusting one of the first and second exposure settings includes decreasing the first exposure setting in response to the first measurement being less than the second measurement.

* * * * *